(12) United States Patent
Miyoshi et al.

(10) Patent No.: US 10,520,572 B2
(45) Date of Patent: Dec. 31, 2019

(54) MAGNETIC RESONANCE APPARATUS

(71) Applicant: General Electric Company, Schenectady, NY (US)

(72) Inventors: Mitsuharu Miyoshi, Tokyo (JP); Naoyuki Takei, Tokyo (JP)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 144 days.

(21) Appl. No.: 15/539,182

(22) PCT Filed: Dec. 21, 2015

(86) PCT No.: PCT/US2015/067083
§ 371 (c)(1),
(2) Date: Jun. 23, 2017

(87) PCT Pub. No.: WO2016/106209
PCT Pub. Date: Jun. 30, 2016

(65) Prior Publication Data
US 2017/0371016 A1 Dec. 28, 2017

(30) Foreign Application Priority Data
Dec. 25, 2014 (JP) .................................. 2014-262969

(51) Int. Cl.
*G01R 33/561* (2006.01)
*G01R 33/48* (2006.01)
(Continued)

(52) U.S. Cl.
CPC ....... *G01R 33/561* (2013.01); *G01R 33/4818* (2013.01); *G01R 33/4838* (2013.01);
(Continued)

(58) Field of Classification Search
CPC .......................... G01R 33/561; G01R 33/4818
(Continued)

(56) References Cited

U.S. PATENT DOCUMENTS 5,621,321 A 4/1997 Liu et al.
6,483,307 B2 11/2002 Ookawa
(Continued)

FOREIGN PATENT DOCUMENTS

EP 2525233 A1 11/2012
JP 2001-170023 A 6/2001
(Continued)

OTHER PUBLICATIONS

English translation of office action for JP patent application No. 2014-262969.
(Continued)

*Primary Examiner* — Reena Aurora

(57) ABSTRACT

A magnetic resonance imaging apparatus comprises a scanning unit for performing a pulse sequence PS including a MT (Magnetization Transfer) pulse b for lessening signals from the cerebral parenchyma (white matter and gray matter). The scanning unit performs the pulse sequence PS in periods of time P1 and P3 in the pulse sequence PS so that the MT pulse b is applied every repetition time TR, while it performs the pulse sequence PS in a period of time P2 in the pulse sequence PS so that no MT pulse b is applied.

15 Claims, 17 Drawing Sheets

(51) Int. Cl.
  *G01R 33/483* (2006.01)
  *G01R 33/56* (2006.01)
  *G01R 33/563* (2006.01)
  *G01R 33/28* (2006.01)
  *G01R 33/54* (2006.01)

(52) U.S. Cl.
  CPC ..... G01R 33/5607 (2013.01); G01R 33/5635 (2013.01); *G01R 33/288* (2013.01); *G01R 33/482* (2013.01); *G01R 33/4824* (2013.01); *G01R 33/543* (2013.01); *G01R 33/5605* (2013.01)

(58) Field of Classification Search
  USPC ......................................................... 324/300
  See application file for complete search history.

(56) References Cited

U.S. PATENT DOCUMENTS

| | | | |
|---|---|---|---|
| 8,854,041 | B2 | 10/2014 | Wheaton et al. |
| 2008/0061779 | A1 | 3/2008 | Feiweier |
| 2008/0224698 | A1 | 9/2008 | Kanda |
| 2013/0123611 | A1 | 5/2013 | Riederer et al. |
| 2015/0204959 | A1* | 7/2015 | Grodzki ............... G01R 33/543 324/314 |
| 2016/0349340 | A1* | 12/2016 | Choi .................. G01R 33/4818 |

FOREIGN PATENT DOCUMENTS

| | | |
|---|---|---|
| JP | 2004-261619 A | 9/2004 |
| JP | 2008-220861 A | 9/2008 |
| JP | 2010042245 A | 2/2010 |
| JP | 2012-239884 A | 12/2012 |
| KR | 10-2010-0002148 A | 1/2010 |

OTHER PUBLICATIONS

International Search Report and Written Opinion for International Application No. PCT/US2015/067083, dated May 4, 2016, 12 pages.

\* cited by examiner

|  | MTR |
|---|---|
| EXPERIMENT 1 (THE PRESENT EMBODIMENT) | 0.2892 |
| EXPERIMENT 2 (COMPARATIVE EXAMPLE) | 0.2436 |

FIG. 17

ROI

IMAGE IM1

ROI

IMAGE IM2

MAGNETIC RESONANCE APPARATUS

CROSS-REFERENCE TO RELATED APPLICATIONS

This is a national stage application under 35 U.S.C. § 371 (c) of PCT Patent Application No. PCT/US2015/067083, filed on Dec. 21, 2015, which claims priority to Japanese Patent Application No. 2014-262969, filed on Dec. 25, 2014, the disclosures of which are incorporated herein by reference in their entireties.

BACKGROUND

The present invention relates to a magnetic resonance apparatus performing a pulse sequence including an RF pulse for inducing transfer of magnetization.

Known techniques for rendering blood in the head and neck include a method comprising defining a slab in the head and neck, and acquiring data from the slab using 3D time-of-flight MR angiography (TOF-MRA). In the 3D TOF-MRA method, an inflow effect by blood flowing from a region outside of the slab into the slab enables rendering of the blood flowing within the slab.

A slab, however, contains not only blood that is an object to be rendered, but also various kinds of background tissue that are not an object to be rendered. Therefore, it is necessary to fully suppress signals from the background tissue. For example, in rendering blood in the head, the cerebral parenchyma (white matter and gray matter) is tissue unnecessary for rendering blood, and thus, signals from the cerebral parenchyma should be suppressed as much as possible. Known methods for sufficiently lessening signals from the cerebral parenchyma include a method using an MT (Magnetization Transfer) pulse for suppressing signals from the cerebral parenchyma (white matter and gray matter) taking advantage of a magnetization transfer effect.

SUMMARY

The MT pulse is an effective RF pulse for suppressing signals from the cerebral parenchyma and is introduced in many and various references of the 3D TOF-MRA technique using the MT pulse. The MT pulse, however, has a large flip angle (for example, 900 degrees), which poses a problem that the specific absorption rate SAR in imaging a subject increases. Accordingly, in performing a 3D TOF-MRA pulse sequence using the MT pulse, it is necessary to extend the repetition time TR so that an upper limit value of the specific absorption rate SAR is not exceeded, resulting in a problem that the scan time needed to perform the pulse sequence is lengthened.

Therefore, there is a need for a technique to minimize lengthening of the scan time even when a pulse sequence using an MT pulse should be performed.

The present invention, in its one aspect, is a magnetic resonance apparatus comprising a dividing unit for dividing k-space into a plurality of segments so that each of all or some of the plurality of segments includes a first region lying near to a center of k-space and second and third regions lying farther from the center of k-space than the first region does; and a scanning unit for performing a pulse sequence including a first RF pulse for lessening signals from first background tissue in a region to be imaged by inducing transfer of magnetization, the pulse sequence being for acquiring a plurality of first data elements disposed at a plurality of grid points included in the first region, a plurality of second data elements disposed at a plurality of grid points included in the second region, and a plurality of third data elements disposed at a plurality of grid points included in the third region, the scanning unit performing the pulse sequence so that data are acquired in each of the all or some segments in the order of the plurality of first data elements, the plurality of second data elements, and the plurality of third data elements; wherein in a first period of time for acquiring the plurality of first data elements in the first region within a period of time over which the pulse sequence is performed, the scanning unit performs the pulse sequence so that the first RF pulse is applied every first time interval; in a second period of time for acquiring the plurality of second data elements in the second region within the period of time over which the pulse sequence is performed, the scanning unit performs the pulse sequence so that no the first RF pulse is applied in a second time interval longer than the first time interval; and in a third period of time for acquiring the plurality of third data elements in the third region within the period of time over which the pulse sequence is performed, the scanning unit performs the pulse sequence so that the first RF pulse is applied every third time interval shorter than the second time interval.

Since in acquiring data in the second region, the first RF pulse for lessening signals in the first background tissue by inducing transfer of magnetization is not applied in the second time interval, the number of first RF pulses to be applied while acquiring data in one segment may be reduced. This enables the specific absorption rate (SAR) to be reduced, and therefore, lengthening of the scan time may be minimized.

BRIEF DESCRIPTION OF THE DRAWINGS

FIG. 17 is a diagram showing a result of experimentation; and

DETAILED DESCRIPTION

Now embodiments for practicing the invention will be described hereinbelow, although the present invention is not limited thereto.

Figure 1:
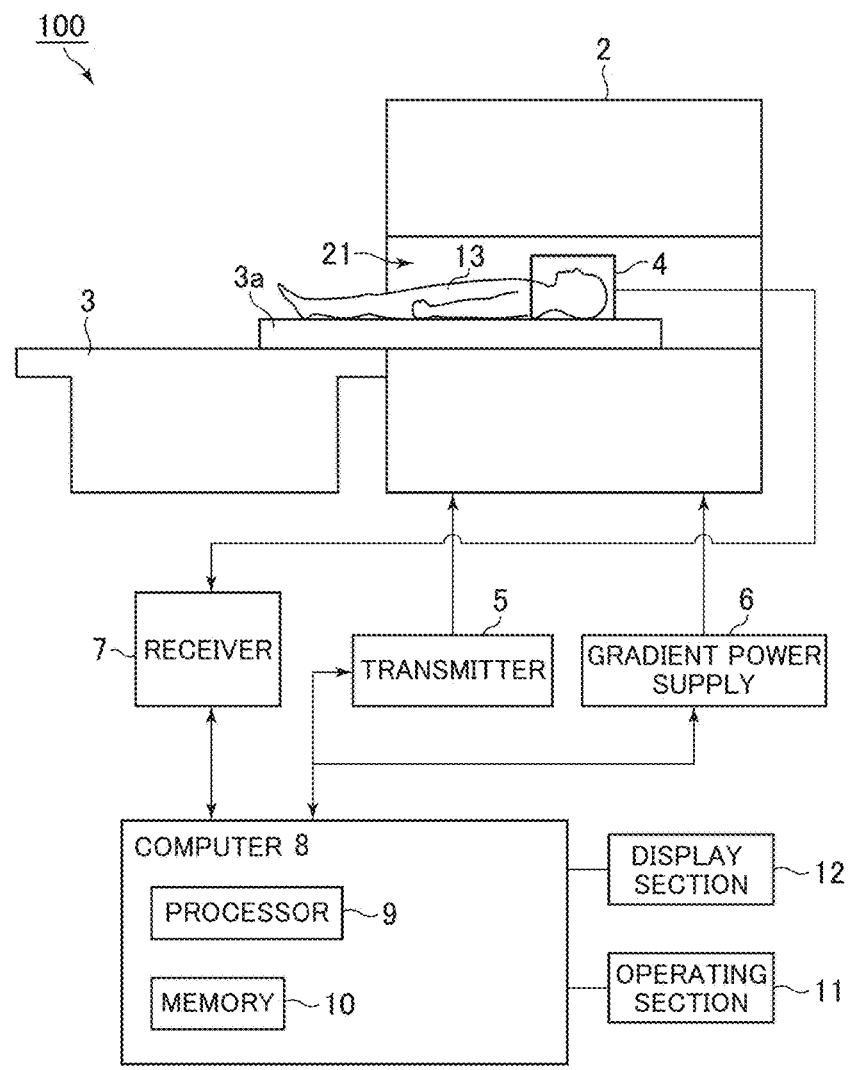
FIG. 1 is a schematic diagram of a magnetic resonance imaging apparatus in an embodiment of the present invention.

FIG. 1 is a schematic diagram of a magnetic resonance imaging apparatus in one embodiment of the present invention.

A magnetic resonance apparatus (referred to hereinbelow as "MR imaging apparatus") 100 comprises a magnet 2, a table 3, and an RF receive coil (referred to hereinbelow as "receive coil") 4.

The magnet 2 has therein a bore 21 through which a subject 13 is inserted. The magnet 2 comprises a superconductive coil for generating a static magnetic field, a gradient coil for applying a gradient magnetic field, and an RF coil for applying RF pulses. A permanent magnet may be used in place of the superconductive coil.

The table 3 has a cradle 3a. The cradle 3a is configured to be movable into the bore 21. The subject 13 is carried into the bore 21 by the cradle 3a.

The receive coil 4 is attached to the head of the subject 13. The receive coil 4 receives magnetic resonance signals from the subject 13.

The MR imaging apparatus 100 further comprises a transmitter 5, a gradient power supply 6, a receiver 7, a computer 8, an operating section 11, and a display section 12.

The transmitter 5 supplies electric current to the RF coil, and the gradient magnetic field power source 6 supplies electric current to the gradient coil. The receiver 7 applies signal processing such as modulation/detection to signals received from the receive coil 4. A combination of the magnet 2, receive coil 4, transmitter 5, gradient power supply 6, and receiver 7 corresponds to the scanning unit.

The computer 8 controls operation of several sections in the MR imaging apparatus 100 to implement several kinds of operation of the MR imaging apparatus 100, such as an operation of transmitting required information to the display section 12, and an operation of reconstructing images. The computer 8 comprises a processor 9 and a memory 10.

Figure 2:
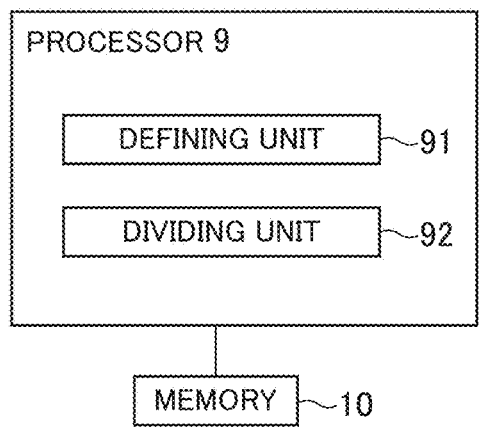
FIG. 2 is a diagram showing a processor.

The memory 10 stores therein programs etc. executed by the processor 9. The memory 10 is an example of recording media readable by the processor 9. The programs executed in the processor 9 may be stored in a non-transitory recording medium such as a hard disk. The programs executed in the processor 9 may be stored in a storage medium, such as, for example, RAM (Random Access Memory), ROM (Read Only Memory), a CD (Compact Disk), a DVD (Digital Versatile Disk), a flexible disk, a magneto-optical disk, or a hard disk. The processor 9 executes processing written in the programs. FIG. 2 illustrates a processor 9. The processor 9 constitutes defining unit 91, dividing unit 92, etc. by loading a program stored in the memory 10.

The defining unit 91 defines scan conditions and the like, such as a slab SL (see FIG. 6), which will be discussed later. The dividing unit 92 divides k-space into a plurality of segments based on the scan conditions defined by the defining unit 91.

The processor 9 is an example that constitutes the defining unit 91 and dividing unit 92, and it functions as these unit by executing programs stored in the memory 10.

The operating section 11 is operated by an operator for inputting several kinds of information to the computer 8. The display section 12 displays several kinds of information.

The MR imaging apparatus 100 is configured as described above.

The present embodiment will address a case in which the MR imaging apparatus is used to acquire an image of arterial blood flowing through the head of a subject.

Figure 3:
FIG. 3 is a diagram showing scans executed in an embodiment.

FIG. 3 is a diagram showing scans executed in an embodiment.

In the present embodiment, a localizer scan LX and a main scan MS are performed.

The localizer scan LX is a scan for acquiring an image used for defining a slab SL (see FIG. 6), which will be discussed later.

The main scan MS is a 3D scan for imaging arterial blood in the head of the subject using a pulse sequence PS (see FIG. 9), which will be discussed later.

Now flow in performing the localizer scan LX and main scan MS will be described.

Figure 4:
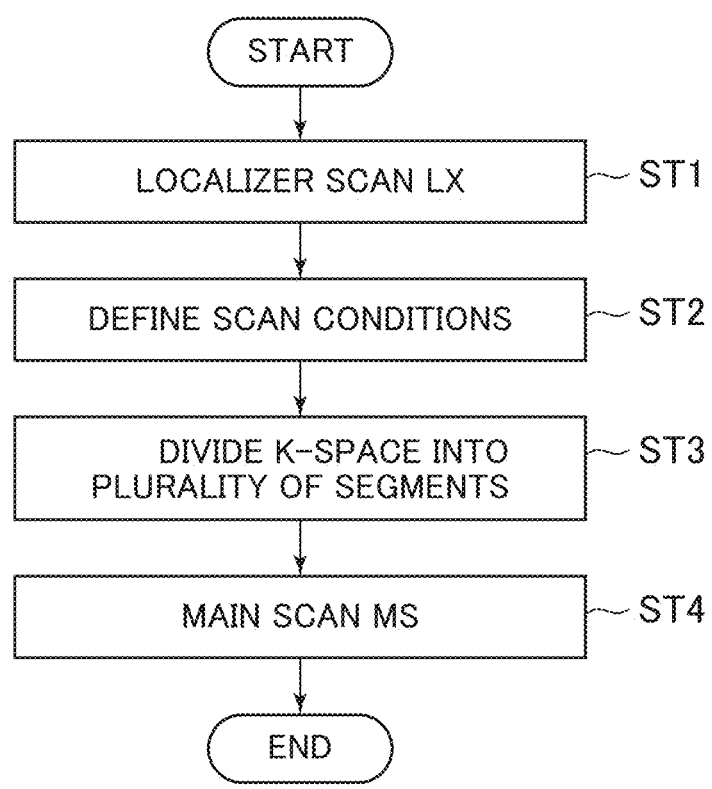
FIG. 4 is a diagram showing a flow chart for performing the scans shown in FIG. 3.

FIG. 4 is a diagram showing a flow chart for performing the scans shown in FIG. 3.

Figure 5:
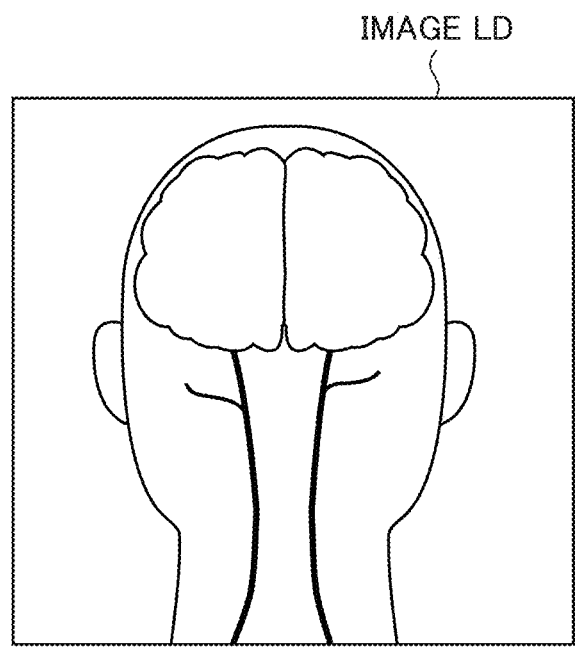
FIG. 5 is a diagram schematically showing an image LD obtained by a localizer scan LX.

At Step ST1, the localizer scan LX is performed. FIG. 5 schematically shows an image LD acquired by the localizer scan LX. After performing the localizer scan LX, the flow goes to Step ST2.

Figure 6:
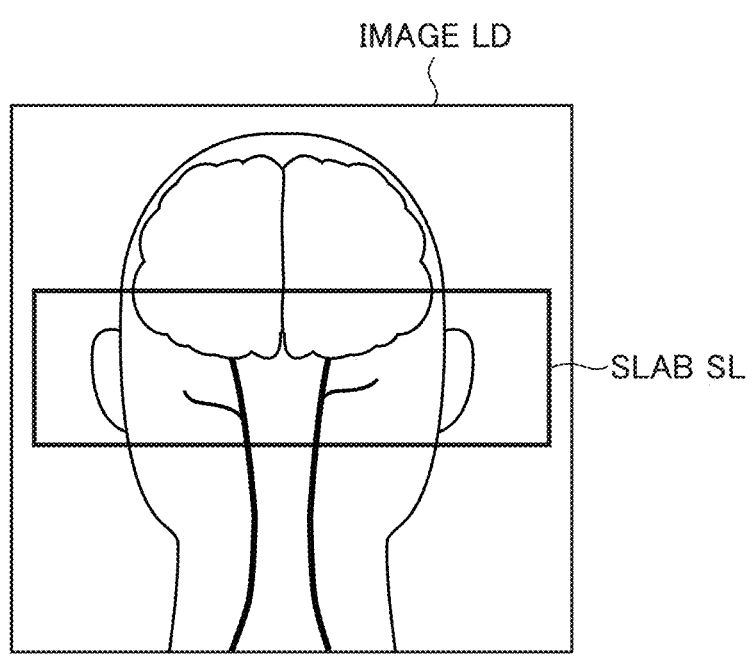
FIG. 6 is a diagram schematically showing a slab SL on the image LD of FIG. 5.

At Step ST2, the operator specifies scan conditions. The scan conditions include, for example, a slab representing the imaging coverage in the main scan MS, a resolution in a frequency-encoding direction, and a resolution in a phase-encoding direction. The operator inputs information for defining a slab from the operating section. Once the information has been input, the defining unit 91 (see FIG. 2) defines a slab based on the information input from the operating section. FIG. 6 schematically shows a slab SL on the image LD of FIG. 5. The operator also inputs information for specifying other scan conditions (for example, a resolution in the frequency-encoding direction and a resolution in the phase-encoding direction) from the operating section. Once the information has been input, the defining unit 91 defines the other scan conditions based on the information input from the operating section. After the scan conditions have been defined, the flow goes to Step ST3.

At Step ST3, the dividing unit 92 (see FIG. 2) divides k-space into a plurality of segments $SEG_1$ to $SEG_n$ (see FIG. 7) based on the scan conditions specified by the operator.

Figure 7:
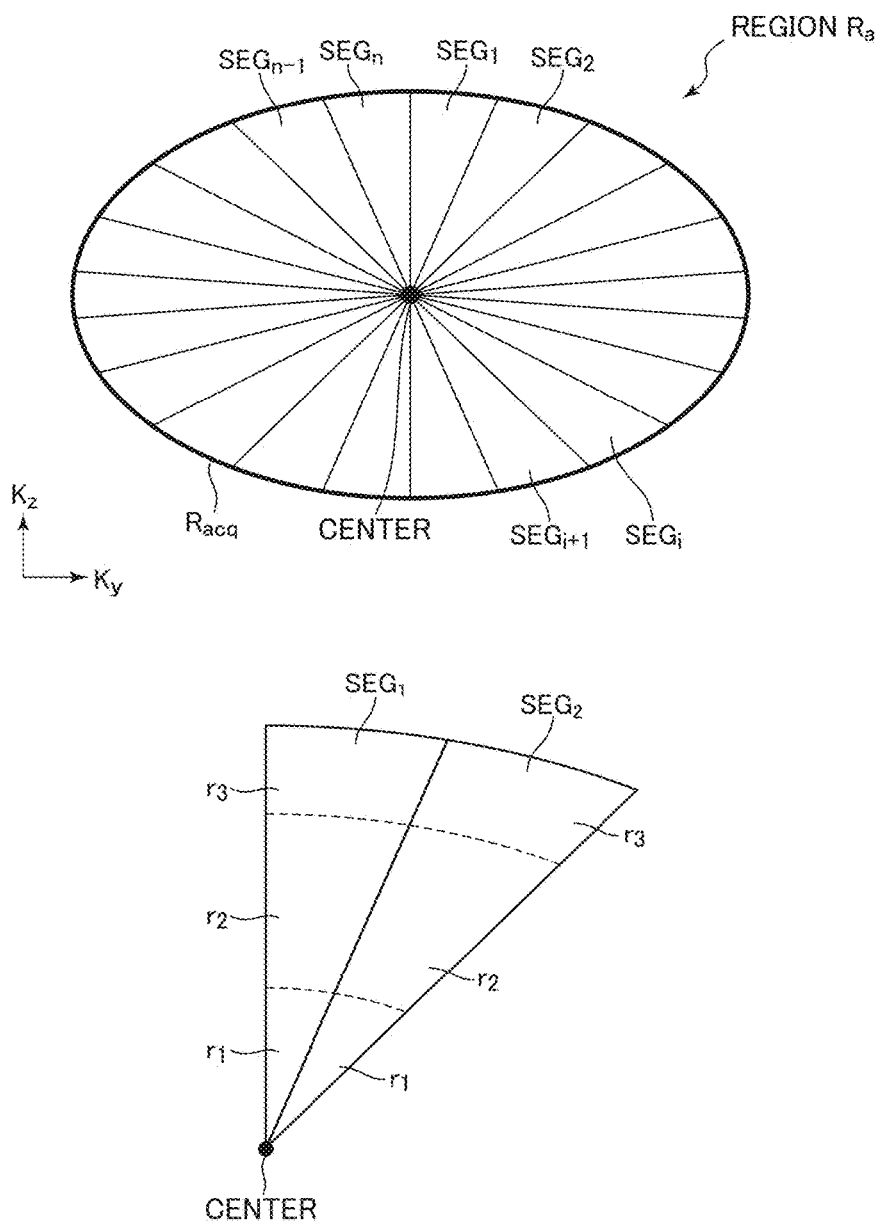
FIG. 7 is an explanatory diagram of dividing k-space into a plurality of segments.

FIG. 7 is an explanatory diagram of dividing k-space into a plurality of segments.

The dividing unit 92 divides a k-space (ky, kz) plane into a region for which data acquisition is performed and that for which no data acquisition is performed. FIG. 7 schematically shows only a region $R_a$ for which data acquisition is performed within the k-space (ky, kz) plane. The dividing unit 92 divides the region $R_a$ in k-space into the plurality of segments $SEG_1$ to $SEG_n$ based on the scan conditions defined at Step ST2. FIG. 7 shows in its lower portion an enlarged view of representative ones of the plurality of segments $SEG_1$ to $SEG_n$: segments $SEG_1$ and $SEG_2$.

The segments $SEG_1$ and $SEG_2$ include a region r1 lying near to the center of k-space, and a region r2 lying farther from the center than the region r1 does, and a region r3 lying farther from the center than the region r2 does.

While the two segments $SEG_1$ and $SEG_2$ are described as having three regions r1, r2, and r3 in FIG. 7, the other segments have three regions r1, r2, and r3 similarly to the segments $SEG_1$ and $SEG_2$.

After k-space has been divided into the plurality of segments $SEG_1$ to $SEG_n$, the flow goes to Step ST4.

At Step ST4, a main scan MS is performed for acquiring an image of arterial blood from the slab SL. Now the main scan MS will be described.

Figure 8:
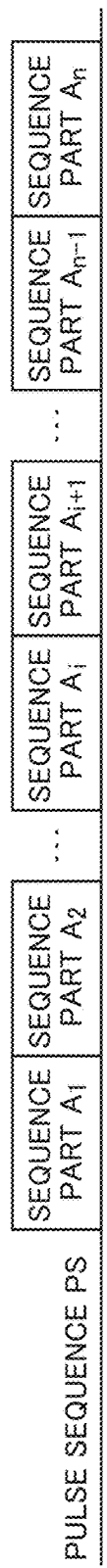
FIG. 8 is a diagram explaining a main scan MS.

FIG. 8 is a diagram explaining the main scan MS.

In the main scan MS, a pulse sequence PS employing the 3D TOF (Time-of-Flight) method is performed for rendering arterial blood in the head of the subject. The pulse sequence PS has sequence parts $A_j$ (j is an integer ranging from j=1 to n). Next, the sequence parts $A_1$ to $A_n$ will be described one by one.

Figure 9:
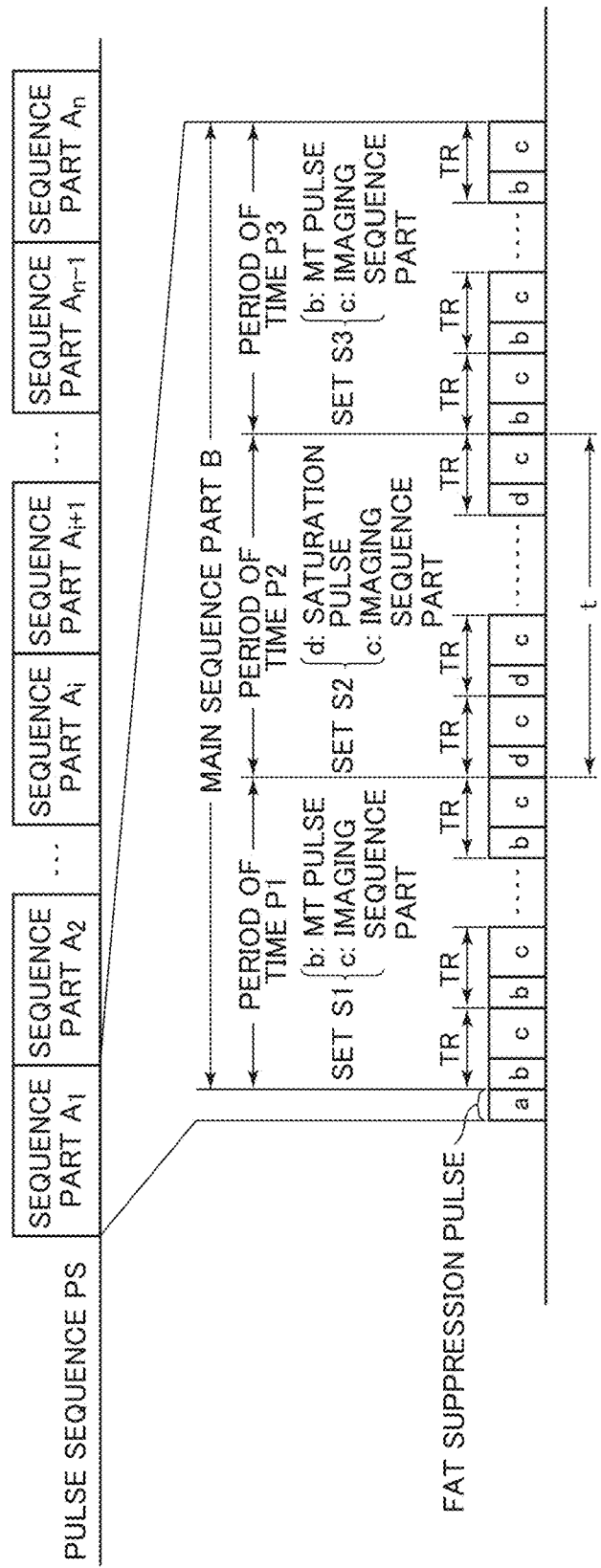
FIG. 9 is a diagram explaining a sequence part $A_1$.

FIG. 9 is a diagram explaining the sequence part $A_1$.

The sequence part $A_1$ has a fat suppression pulse a. The fat suppression pulse a is a pulse for suppressing fat signals in the slab SL. The sequence part $A_1$ also has a main sequence part B.

The main sequence part B is divided into three periods of time P1, P2, and P3.

In the period of time P1, a set S1 of an MT (Magnetization Transfer) pulse b and an imaging sequence part c is performed in a repetition time TR. The MT pulse b is a pulse for suppressing signals from the cerebral parenchyma (white matter and gray matter) using the magnetization transfer effect. The imaging sequence part c is a sequence part for acquiring imaging data disposed at grid points in k-space. In the period of time P1, the set S1 of the MT pulse b and imaging sequence part c is performed a plurality of number of times.

In the period of time P2, a set S2 of a saturation pulse d and the imaging sequence part c is performed in the repetition time TR. The saturation pulse d is a pulse for suppressing signals from venous blood. The imaging sequence part c is a sequence part for acquiring imaging data disposed at grid points in k-space. In the period of time P2, the set S2 of the saturation pulse d and imaging sequence part c is performed a plurality of number of times.

In the period of time P3, a set S3 of the MT pulse b and imaging sequence part c is performed in the repetition time TR, as in the period of time P1. In the period of time P3, the set S3 of the MT pulse b and imaging sequence part c is performed a plurality of number of times.

Therefore, the MT pulse is applied in the periods of time P1 and P3, while no MT pulse is applied in the period of time P2. Since a time interval t from the start to the end of the period of time P2 is $t=x \cdot TR$ (x is an integer satisfying $x \geq 2$), the period of time P2 is defined such that no MT pulse is applied over $t=x \cdot TR$.

While the sequence part $A_1$ is illustrated in FIG. 9, the other sequence parts $A_2$ to $A_n$ have the fat suppression pulse a and main sequence part B, as in the sequence part $A_1$.

In the main scan MS, the pulse sequence PS shown in FIG. 9 is used to acquire data in a region $R_a$ (see FIG. 7) in k-space. A method of acquiring data disposed in the region $R_a$ in k-space will now be described.

Figure 10:
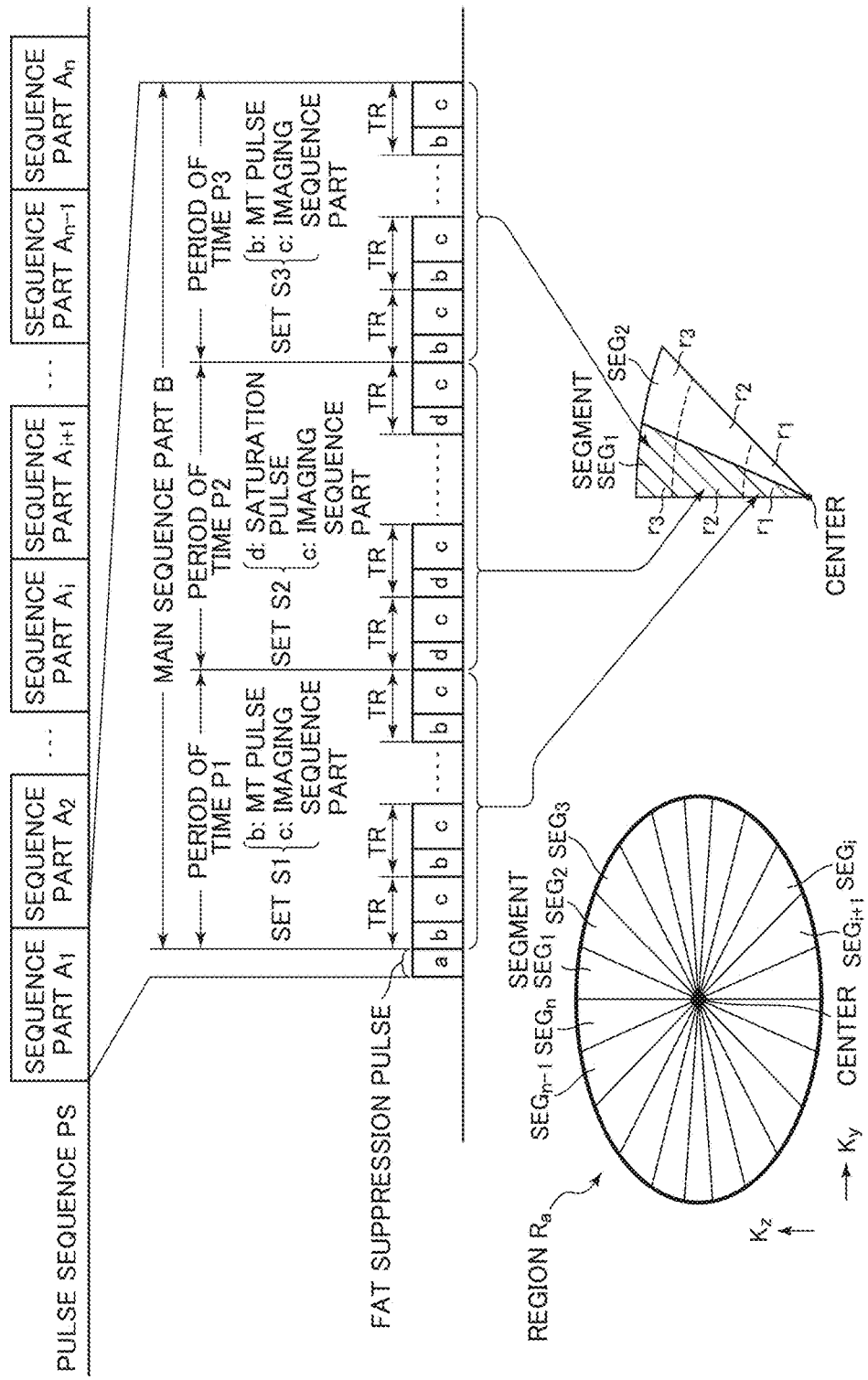
FIG. 10 is an explanatory diagram of acquiring data by performing the sequence part $A_1$.

In the main scan MS, the sequence part $A_1$ in the pulse sequence PS is first performed (see FIG. 10).

FIG. 10 is an explanatory diagram of acquiring data by performing the sequence part $A_1$.

In the period of time P1 in the sequence part $A_1$, imaging data disposed at grid points in the region r1 in a segment $SEG_1$ are acquired. In the period of time P2 in the sequence part $A_1$, imaging data disposed at grid points in the region r2 in the segment $SEG_1$ are acquired. In the period of time P3 in the sequence part $A_1$, imaging data disposed at grid points in the region r3 in the segment $SEG_1$ are acquired.

Therefore, while imaging data in the region r1 in the segment $SEG_1$ are being acquired (period of time P1), the MT pulse b is applied every repetition time TR. However, while imaging data in the region r2 in the segment $SEG_1$ are being acquired (period of time P2), the saturation pulse d is applied in place of the MT pulse b. The saturation pulse d is applied every repetition time TR. Moreover, while imaging data in the region r3 in the segment $SEG_1$ are being acquired (period of time P3), the MT pulse b is applied every repetition time TR, as in the period of time P1.

In the period of time P1 in the sequence part $A_1$, the MT pulse b is applied every repetition time TR. By thus applying the MT pulse b, magnetization transfer for lessening longitudinal magnetization in the cerebral white matter and gray matter may be intensively induced while acquiring imaging data disposed in the region r1 lying near to the center of k-space on the low-frequency side, and therefore, signals from the cerebral white matter and gray matter may be suppressed.

In the period of time P2 in the sequence part $A_1$, the saturation pulse d is applied every repetition time TR. By thus applying the saturation pulse d, signals from venous blood may be lessened.

Figure 11:
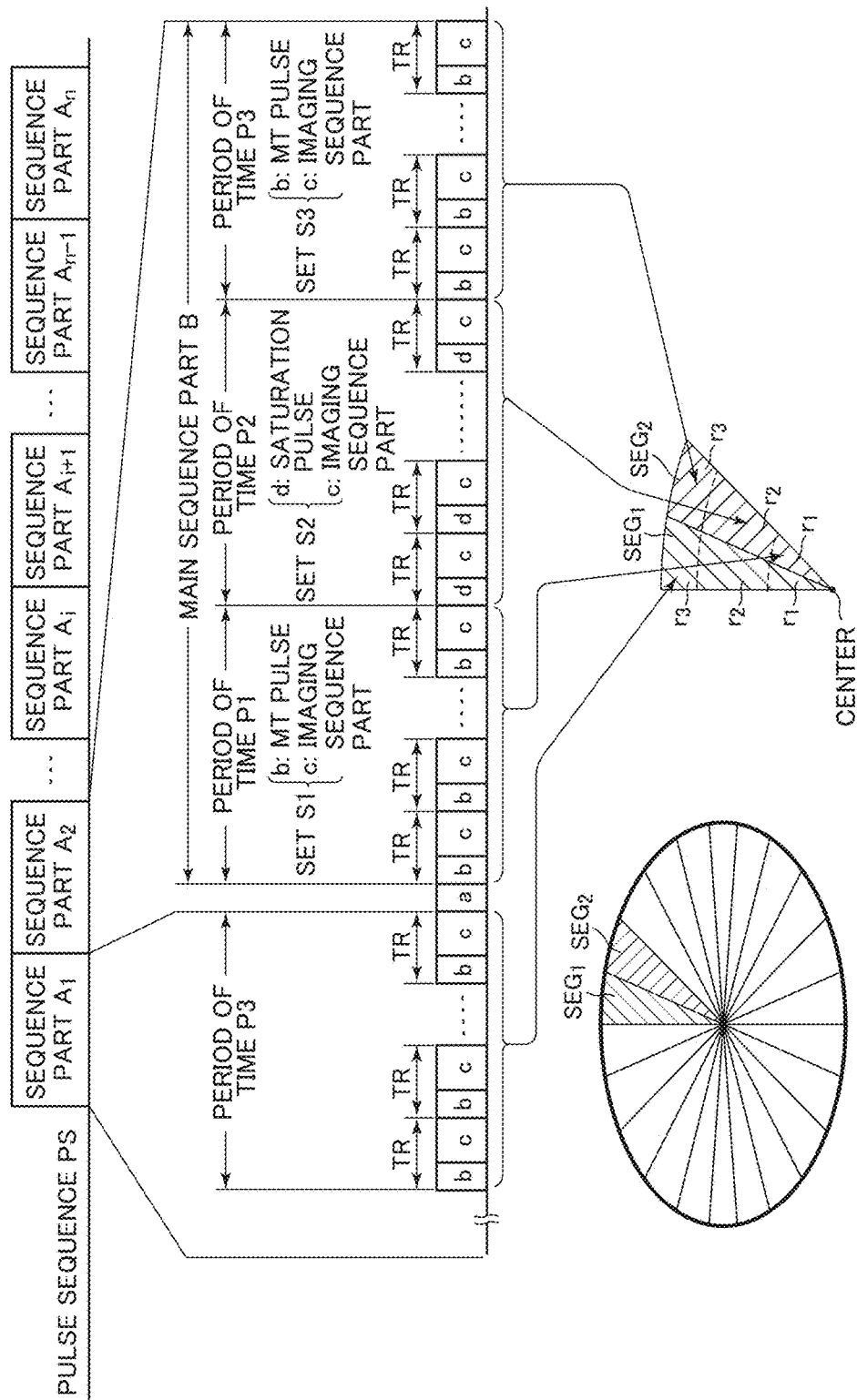
FIG. 11 is an explanatory diagram of acquiring data by performing a sequence part $A_2$.

After performing the sequence part $A_1$, a next sequence part $A_2$ is performed (see FIG. 11).

FIG. 11 is an explanatory diagram of acquiring data by performing the sequence part $A_2$. In FIG. 11, the period of time P3 in the sequence $A_1$ is shown, in addition to periods of time P1, P2, and P3 in the sequence part $A_2$ for convenience of explanation.

In the period of time P1 in the sequence part $A_2$, imaging data disposed at grid points in the region r1 in a segment $SEG_2$ are acquired. In the period of time P2 in the sequence part $A_2$, imaging data disposed at grid points in the region r2 in the segment $SEG_2$ are acquired. In the period of time P3 in the sequence part $A_2$, imaging data disposed at grid points in the region r3 in the segment $SEG_2$ are acquired.

Therefore, while imaging data in the region r1 in the segment $SEG_2$ are being acquired (period of time P1), the MT pulse b is applied every repetition time TR. However, while imaging data in the region r2 in the segment $SEG_2$ are being acquired (period of time P2), the saturation pulse d is applied in place of the MT pulse b. The saturation pulse d is applied every repetition time TR. Moreover, while imaging data in the region r3 in the segment $SEG_2$ are being acquired (period of time P3), the MT pulse b is applied every repetition time TR, as in the period of time P1.

In the period of time P1 in the sequence part $A_2$, the MT pulse b is applied every repetition time TR. By thus applying the MT pulse b, magnetization transfer for lessening longitudinal magnetization in the cerebral white matter and gray matter may be intensively induced while acquiring imaging data disposed in the region r1 lying near to the center of k-space on the low-frequency side. Moreover, according to the present embodiment, the MT pulse b is applied every repetition time TR in the period of time P3 in the sequence part $A_1$ immediately before the sequence part $A_2$. Therefore, before acquiring data in the region r1 in the segment $SEG_2$ in the sequence part $A_2$, longitudinal magnetization in the cerebral white matter and gray matter may be lessened to a certain degree by the MT pulse b applied in the period of time P3 in the sequence part $A_1$. Thus, since according to the present embodiment, longitudinal magnetization in the cerebral white matter and gray matter is lessened to a certain degree in the period of time P3 in the sequence part $A_1$, and thereafter, the MT pulse b is applied in the period of time P1 in the next sequence part $A_2$, longitudinal magnetization in the cerebral white matter and gray matter may be brought sufficiently close to the steady state within the period of time P1 in the sequence part $A_2$. Since longitudinal magnetization in the cerebral white matter and gray matter may be thus sufficiently lessened within the period of time P1 in the sequence part $A_2$, signals from the cerebral white matter and gray matter may be fully suppressed.

In the period of time P2 in the sequence part $A_2$, the saturation pulse d is applied every repetition time TR. By thus applying the saturation pulse d, signals from venous blood may be lessened.

Similarly, thereafter, the sequence part is performed.

Figure 12:
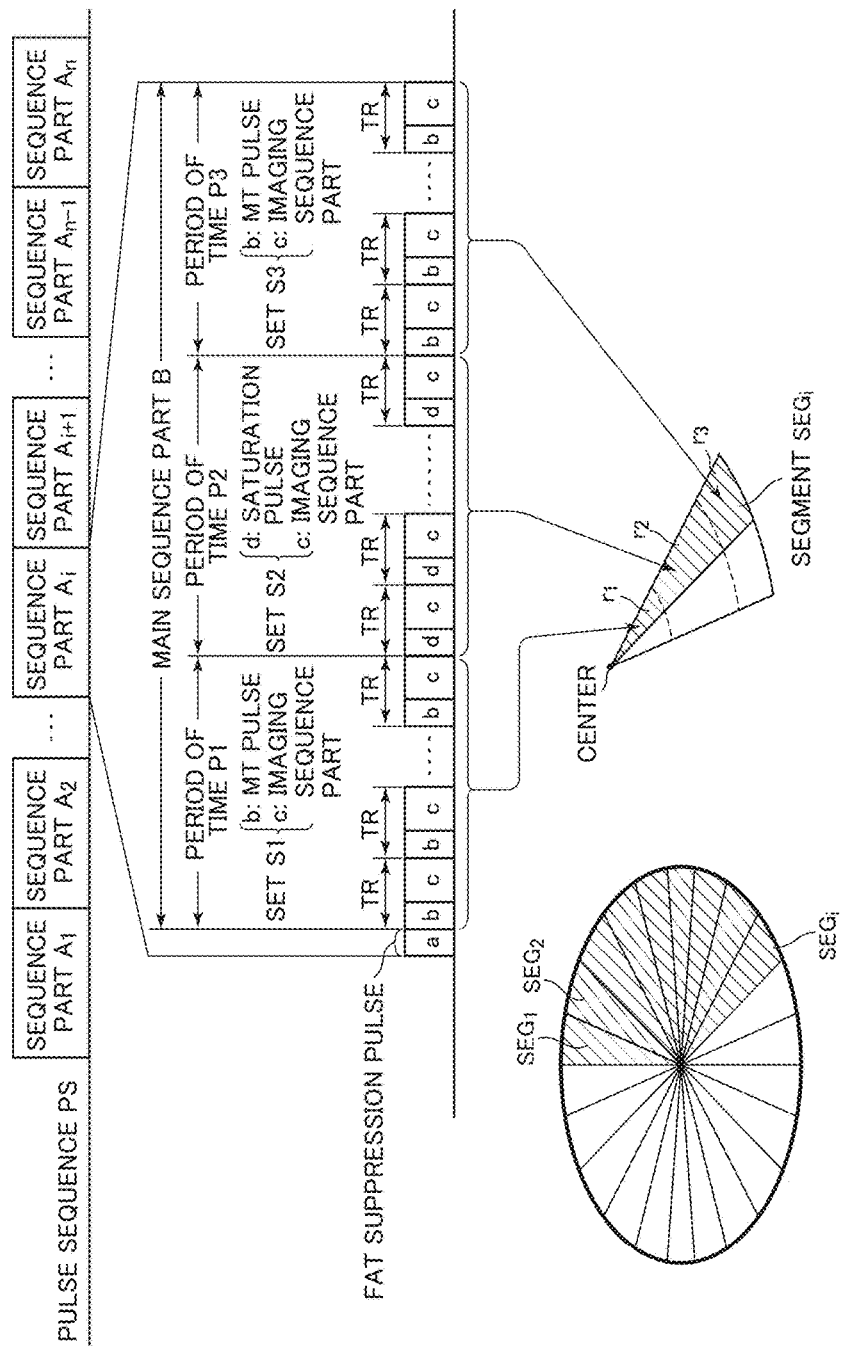
FIG. 12 is an explanatory diagram of acquiring data by performing a sequence part $A_i$.

FIG. 12 is an explanatory diagram of acquiring data by performing a sequence part $A_i$.

In the period of time P1 in the sequence part $A_i$, imaging data disposed at grid points in the region r1 in a segment $SEG_i$ are acquired. In the period of time P2 in the sequence part $A_i$, imaging data disposed at grid points in the region r2 in the segment $SEG_i$ are acquired. In the period of time P3 in the sequence part $A_i$, imaging data disposed at grid points in the region r3 in the segment $SEG_i$ are acquired.

Therefore, while imaging data in the region r1 in the segment $SEG_i$ are being acquired (period of time P1), the MT pulse b is applied every repetition time TR. However, while imaging data in the region r2 in the segment $SEG_i$ are being acquired (period of time P2), the saturation pulse d is applied in place of the MT pulse b. The saturation pulse d is applied every repetition time TR. Moreover, while imaging data in the region r3 in the segment $SEG_i$ are being acquired (period of time P3), the MT pulse b is applied every repetition time TR, as in the period of time P1.

After performing the sequence part $A_i$, a next sequence part $A_{i+1}$ is performed.

Figure 13:
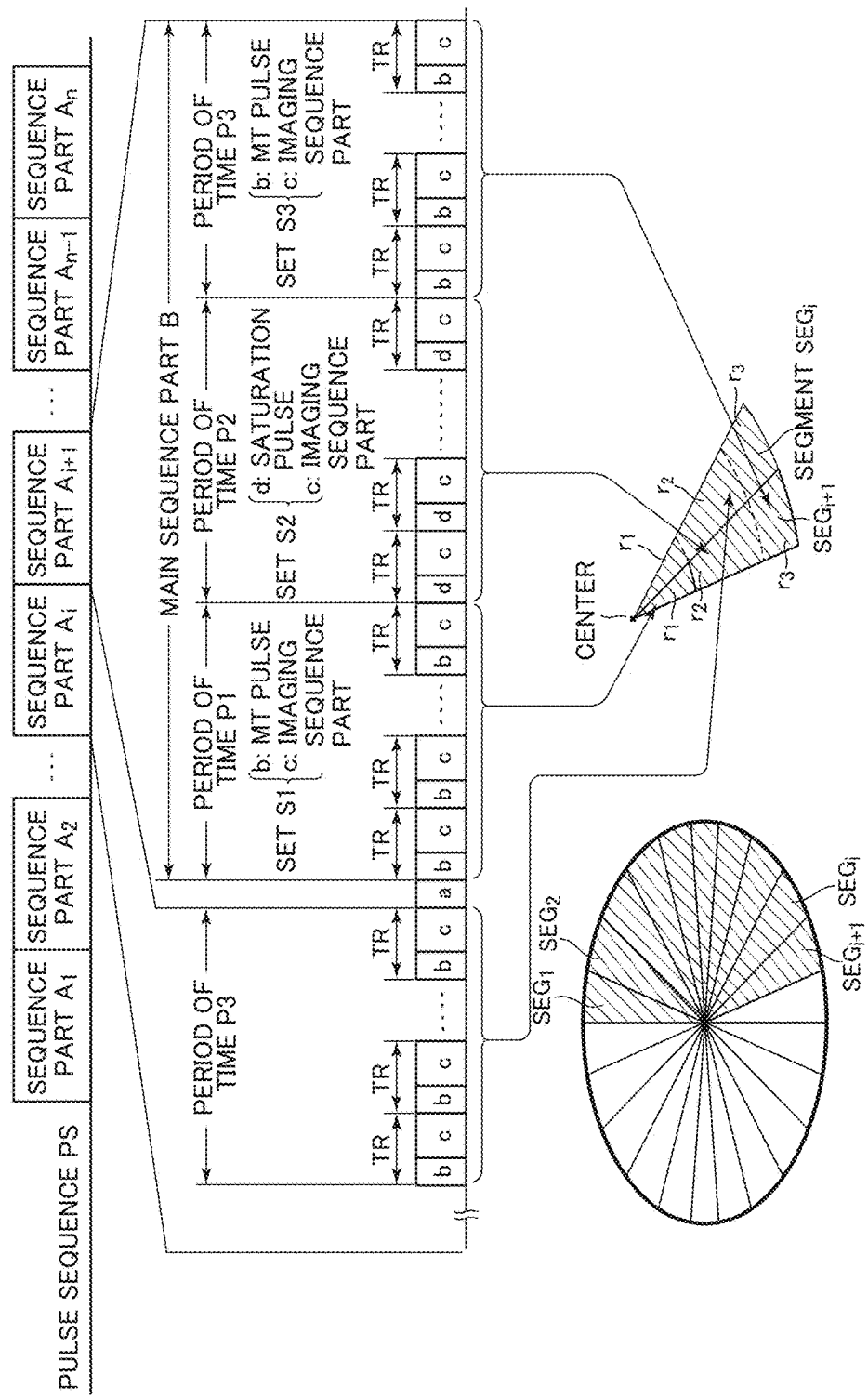
FIG. 13 is an explanatory diagram of acquiring data by performing a sequence part $A_{i+1}$.

FIG. 13 is an explanatory diagram of acquiring data by performing the sequence part $A_{i+1}$. In FIG. 13, the period of time P3 in the sequence $A_i$ is shown, in addition to periods of time P1, P2, and P3 in the sequence part $A_{i+1}$ for convenience of explanation.

In the period of time P1 in the sequence part $A_{i+1}$, imaging data disposed at grid points in the region r1 in a segment $SEG_{i+1}$ are acquired. In the period of time P2 in the sequence part $A_{i+1}$, imaging data disposed at grid points in the region r2 in the segment $SEG_{i+1}$ are acquired. In the period of time P3 in the sequence part $A_{i+1}$, imaging data disposed at grid points in the region r3 in the segment $SEG_{i+1}$ are acquired.

Therefore, while imaging data in the region r1 in the segment $SEG_{i+1}$ are being acquired (period of time P1), the MT pulse b is applied every repetition time TR. However, while imaging data in the region r2 in the segment $SEG_{i+1}$ are being acquired (period of time P2), the saturation pulse d is applied in place of the MT pulse b. The saturation pulse d is applied every repetition time TR. Moreover, while imaging data in the region r3 in the segment $SEG_{i+1}$ are being acquired (period of time P3), the MT pulse b is applied every repetition time TR, as in the period of time P1.

In the period of time P1 in the sequence part $A_{i+1}$, the MT pulse b is applied every repetition time TR. By thus applying the MT pulse b, magnetization transfer for lessening longitudinal magnetization in the cerebral white matter and gray matter may be intensively induced while acquiring imaging data disposed in the region r1 lying near to the center of k-space on the low-frequency side. Moreover, according to the present embodiment, the MT pulse b is applied every repetition time TR in the period of time P3 in the sequence part $A_i$ immediately before the sequence part $A_{i+1}$. Therefore, before acquiring data in the region r1 in the segment $SEG_2$ in the sequence part $A_{i+1}$, longitudinal magnetization in the cerebral white matter and gray matter may be lessened to a certain degree by the MT pulse b applied in the period of time P3 in the sequence part $A_i$. Thus, since according to the present embodiment, longitudinal magnetization in the cerebral white matter and gray matter is lessened to a certain degree in the period of time P3 in the sequence part $A_i$, and thereafter, the MT pulse b is applied in the period of time P1 in the next sequence part $A_{i+1}$, longitudinal magnetization in the cerebral white matter and gray matter may be brought sufficiently close to the steady state within the period of time P1 in the sequence part $A_{i+1}$. Since longitudinal magnetization in the cerebral white matter and gray matter may be thus sufficiently lessened within the period of time P1 in the sequence part $A_{i+1}$, signals from the cerebral white matter and gray matter may be fully suppressed.

Figure 14:
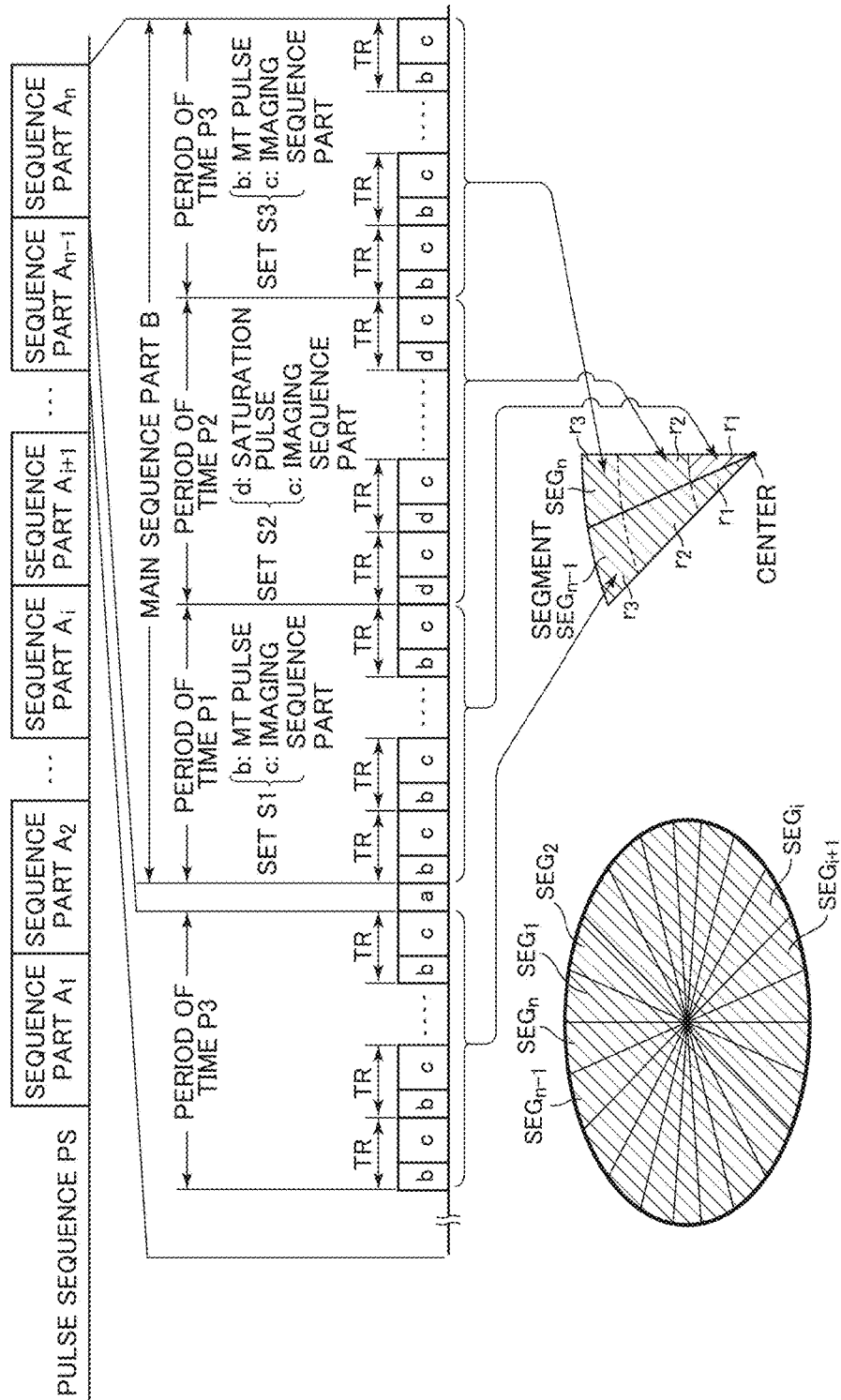
FIG. 14 is an explanatory diagram of acquiring data by performing a sequence part $A_n$.

Similarly, thereafter, the sequence part is performed, and a sequence part $A_n$ is finally performed (see FIG. 14).

FIG. 14 is an explanatory diagram of acquiring data by performing the sequence part $A_n$.

In the period of time P1 in the sequence part $A_n$, imaging data disposed at grid points in the region r1 in a segment $SEG_n$ are acquired. In the period of time P2 in the sequence part $A_n$, imaging data disposed at grid points in the region r2 in the segment $SEG_n$ are acquired. In the period of time P3 in the sequence part $A_n$, imaging data disposed at grid points in the region r3 in the segment $SEG_n$ are acquired.

Therefore, while imaging data in the region r1 in the segment $SEG_n$ are being acquired (period of time P1), the MT pulse b is applied every repetition time TR. However, while imaging data in the region r2 in the segment $SEG_n$ are being acquired (period of time P2), the saturation pulse d is applied in place of the MT pulse b. The saturation pulse d is applied every repetition time TR. Moreover, while imaging data in the region r3 in the segment $SEG_n$ are being acquired (period of time P3), the MT pulse b is applied every repetition time TR, as in the period of time P1.

In this way, data in all the segments $SEG_1$ to $SEG_n$ in k-space are acquired. Once the data in the segments $SEG_1$ to $SEG_n$ in k-space have been acquired, the data in the segments $SEG_1$ to $SEG_n$ may be Fourier-transformed to obtain an image for the slab SL.

According to the present embodiment, the MT pulse b is applied every repetition time TR in the periods of time P1 and P3 among the periods of time P1, P2, and P3 in the sequence part $A_j$ (j=1 to n−1). Therefore, according to the present embodiment, in the meantime from the start of the period of time P3 in the sequence part $A_j$ (j=1 to n−1) to the end of the period of time P1 in the next sequence part $A_{j+1}$, the MT pulse b is applied every repetition time TR. Since by thus applying the MT pulse b, longitudinal magnetization in the cerebral white matter and gray matter is lessened to a certain degree within the period of time P3 in the sequence part $A_j$, and thereafter, the MT pulse b is applied in the period of time P1 in the next sequence part $A_{j+1}$, longitudinal magnetization in the cerebral white matter and gray matter may be brought sufficiently close to the steady state within the period of time P1 in the sequence part $A_{j+1}$. Since longitudinal magnetization in the cerebral white matter and gray matter may be thus sufficiently lessened within the period of time P1 in the sequence part $A_{j+1}$, signals from the cerebral white matter and gray matter may be fully suppressed.

Moreover, according to the present embodiment, the MT pulse b may be intensively applied in the meantime from the start of the period of time P3 in the sequence part $A_j$ (j=1 to n−1) to the end of the period of time P1 in the next sequence part $A_{j+1}$, whereby longitudinal magnetization in the cerebral white matter and gray matter may be sufficiently lessened without applying the MT pulse b in the period of time P2. Therefore, the total number of MT pulses required in the one sequence part $A_j$ to sufficiently lessen longitudinal magnetization in the white matter and gray matter may be reduced. Thus, the pulse sequence PS according to the present embodiment can reduce the specific absorption rate SAR during imaging of a subject, as compared with ordinary pulse sequences using the MT pulse. Moreover, since the specific absorption rate SAR can be reduced, extension of TR can be minimized. This in turn enables lengthening of the scan time of the pulse sequence PS to be minimized.

According to the present embodiment, when acquiring data in each segment, data are acquired in the order of the regions r1, r2, and r3. However, the data may be acquired in the order of the regions r1, r3, and r2. However, to fully bring out the fat suppression effect of the fat suppression pulse a, it is preferable to acquire data in an ascending order of the distance from the center of k-space, that is, in the order of the regions r1, r2, and r3.

Figure 15:
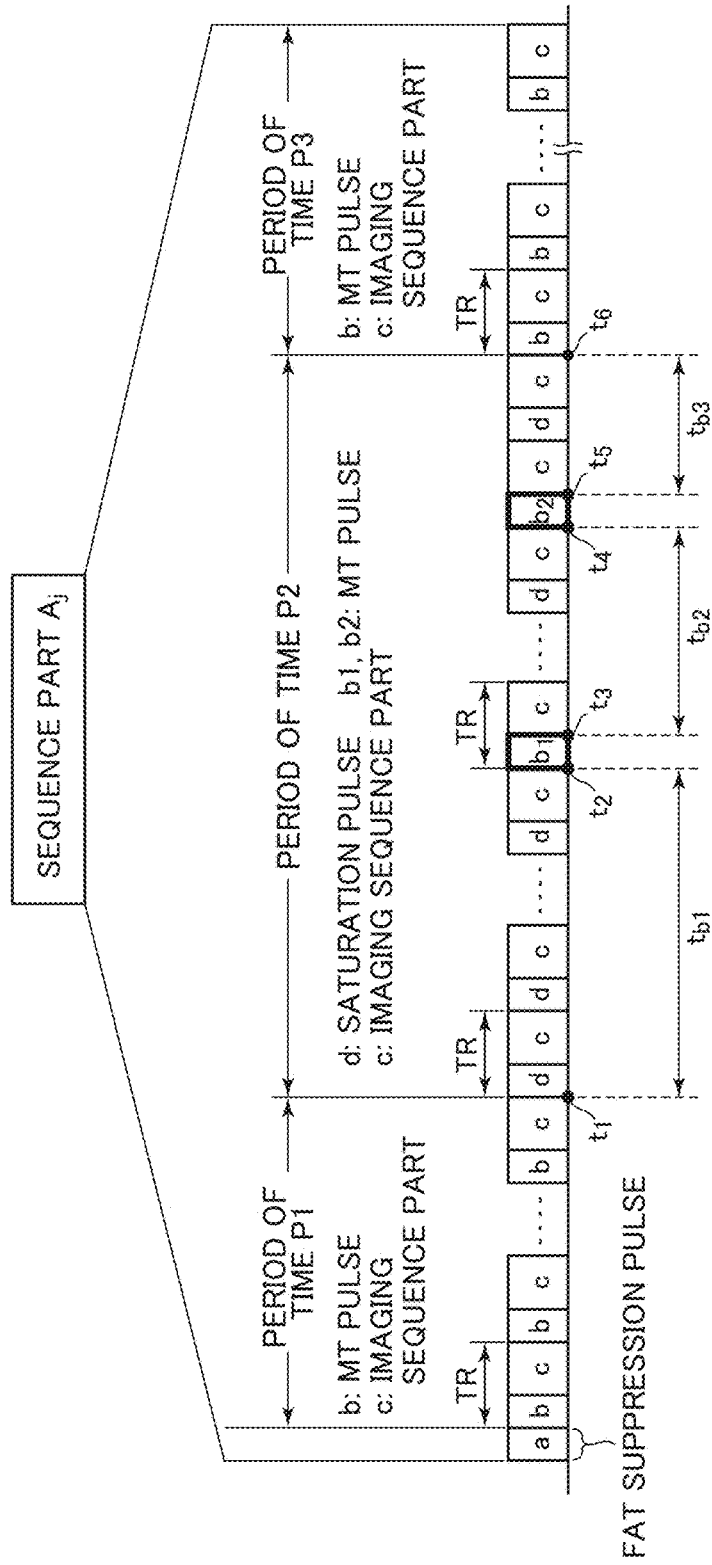
FIG. 15 is a diagram showing a case in which a MT (Magnetization Transfer) pulse is applied in a period of time P2.

Moreover, although no MT pulse b is applied in the period of time P2 in the example provided above, the MT pulse may be applied in the period of time P2 insofar as lengthening of the scan time may be fully suppressed (see FIG. 15).

FIG. 15 is a diagram showing a case in which a MT (Magnetization Transfer) pulse is applied in the period of time P2.

FIG. 15 shows a case in which MT pulses b1 and b2 are applied in the period of time P2. Therefore, three time intervals $t_{b1}$, $t_{b2}$, and $t_{b3}$ in which no MT pulse is applied are present in the period of time P2. The time interval $t_{b1}$ represents a time from a time point t1 of the start of the period of time P2 to a time point t2 of the start of application of an MT pulse. The time interval $t_{b2}$ represents a time from a time point t3 of the end of application of the MT pulse b1 to a time point t4 of the start of application of the MT pulse b2. The time interval $t_{b3}$ represents a time from a time point t5 of the end of application of the MT pulse b2 to a time point t6 of the end of the period of time P2. In FIG. 15, the longest one of the three time intervals $t_{b1}$, $t_{b2}$, and $t_{b3}$ is assumed to be $t_{b1}$. The time interval $t_{b1}$ is defined to be longer than the repetition time TR, and is, for example, $t_{b1}$=10TR. Thus, in the period of time P2, the time interval $t_{b1}$ in which no MT pulse is applied may be defined to be longer than the repetition time TR for the MT pulse in the periods of time P1 and P3, whereby the number of MT pulses applied in the period of time P2 may be sufficiently reduced. Since the total number of MT pulses required in one sequence part $A_j$ may be thus reduced, an increase of the specific absorption rate SAR in imaging the subject can be reduced. Moreover, since an increase of the specific absorption rate SAR can be reduced, extension of TR may be reduced to as short a time interval as possible. This in turn enables lengthening of the scan time of the pulse sequence PS to be reduced to as short a time interval as possible.

Next, description will be made of a difference between the time of application of the MT pulse b used in acquiring data in k-space according to the present embodiment, and that of an MT pulse used in acquiring data in k-space according to PTL 2.

Figure 16A:
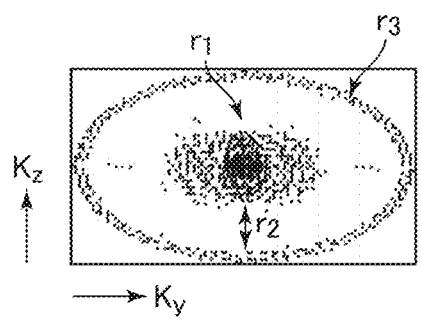
FIGS. 16A and 16B are diagrams explaining a difference in time of application of the MT pulse.
Figure 16B:
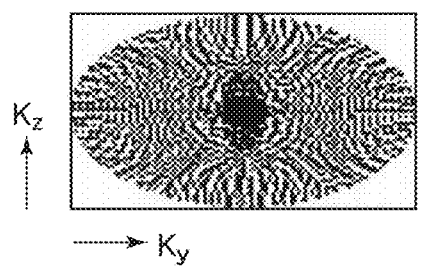

FIGS. 16A and 16B are diagrams explaining a difference in time of application of the MT pulse.

FIG. 16A shows a graph representing the time at which the MT pulse is applied. The horizontal axis of the graph represents a ky-coordinate, while the vertical axis represents a kz-coordinate. A dot in the graph indicates application of an MT pulse. Referring to FIG. 16A, it can be seen that the MT pulse is intensively applied when acquiring data in the region r1 in the vicinity of the center of k-space and data in the region r3 away from the center of k-space, and almost no MT pulse is applied when acquiring data in the region r2 between the region r1 and region r3.

On the other hand, FIG. 16B is a diagram showing the time of application of the MT pulse used in acquiring data in k-space according to PTL 2. A dot in the graph in FIG. 16B indicates the time at which an MT pulse is applied. Therefore, comparing FIG. 16A with FIG. 16B, it can be seen that the total number of the MT pulses may be reduced by the method according to the present embodiment as compared with the method according to PTL 2.

Next, to demonstrate that the signal value for background tissue may be suppressed by applying the MT pulse at the time shown in FIG. 16A, experimentation using an egg white was made. Results of the experimentation will be described hereinbelow.

FIG. 17 shows a result of the experimentation. In Experiment 1, a sequence that applies the MT pulse at the time shown in FIG. 16A was used to acquire data for an egg white, and the MTR (Magnetization Transfer Ratio) was determined based on the acquired data. The MTR refers to an index representing how much the signal value can be suppressed by the MT pulse. Moreover, Experiment 2 was made as comparative example. In Experiment 2, a sequence that applies the MT pulse according to the method in PTL 2 was used to acquire data for an egg white, and the MTR was determined based on the acquired data. It should be noted that the total number of MT pulses used in the sequence in Experiment 1 and that in Experiment 2 are the same.

In Experiment 1, MTR=0.2892, while MTR=0.2436 in Experiment 2. Since the sequence that applies the MT pulse at the time shown in FIG. 16A may thus increase the MTR as compared with the sequence that applies the MT pulse according to the method in PTL 2, the former proves to have a higher effect of background signal suppression.

Figure 18A:
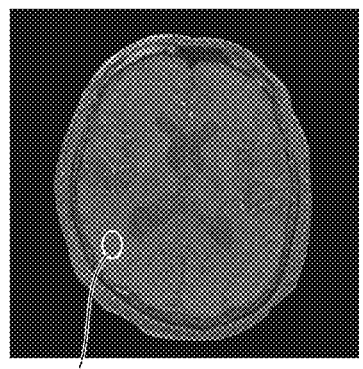
FIGS. 18A and 18B illustrate MR images.
Figure 18B:
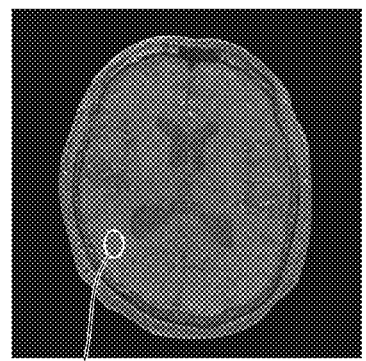

Moreover, to demonstrate that the signal value for background tissue may be suppressed by applying the MT pulse at the time shown in FIG. 16A, a human head was actually imaged. FIGS. 18A and 18B illustrate MR images obtained by the disclosed imaging technique.

FIG. 18A is a picture showing an image IM1 of the head obtained by performing the sequence that applies the MT pulse at the time shown in FIG. 16A. FIG. 18B is a picture showing an image IM2 of the head obtained by performing the sequence that applies the MT pulse at the time shown in FIG. 16B.

The average value of signals in an ROI of the image IM1 in FIG. 18A is 402, while that in an ROI of the image IM2 in FIG. 18B is 439. Therefore, comparing the two images with each other, the image IM1 has signals from the parenchyma lower than the image IM2 has, which proves that signals from background tissue are successfully suppressed.

The present embodiment addresses a case in which an image of blood flow in the head of a subject is acquired. However, the present invention is not limited to the case in which an image of blood flow is acquired, and it may be applied to imaging using an MT pulse.

What is claimed is:

1. A magnetic resonance imaging apparatus comprising:
   a dividing unit configured to divide k-space into a plurality of segments so that each of all or some of said plurality of segments includes a first region lying near to a center of k-space and second and third regions lying farther from the center of k-space than said first region does; and a scanning unit configured to perform a pulse sequence including a first RF pulse for lessening signals from first background tissue in a region to be imaged by inducing transfer of magnetization, said pulse sequence being for acquiring a plurality of first data elements disposed at a plurality of grid points included in said first region, a plurality of second data elements disposed at a plurality of grid points included in said second region, and a plurality of third data elements disposed at a plurality of grid points included in said third region, said scanning unit performing said pulse sequence so that data are acquired in each of said all or some segments in the order of said plurality of first data elements, said plurality of second data elements, and said plurality of third data elements; wherein:

in a first period of time for acquiring said plurality of first data elements in said first region within a period of time over which said pulse sequence is performed, said scanning unit performs said pulse sequence so that said first RF pulse is applied every first time interval;

in a second period of time for acquiring said plurality of second data elements in said second region within the period of time over which said pulse sequence is performed, said scanning unit performs said pulse sequence so that no said first RF pulse is applied in a second time interval longer than said first time interval; and in a third period of time for acquiring said plurality of third data elements in said third region within the period of time over which said pulse sequence is performed, said scanning unit performs said pulse sequence so that said first RF pulse is applied every third time interval shorter than said second time interval.

2. The magnetic resonance imaging apparatus as recited in claim 1, wherein said pulse sequence has a plurality of sequence parts for acquiring data disposed in said plurality of segments.

3. The magnetic resonance imaging apparatus as recited in claim 2, wherein each of said plurality of sequence parts has said first, second, and third periods of time.

4. The magnetic resonance imaging apparatus as recited in claim 3, wherein said scanning unit performs said first RF pulse and a first imaging sequence part for acquiring said first data disposed in said first region in said first period of time.

5. The magnetic resonance imaging apparatus as recited in claim 4, wherein said scanning unit repetitively performs a set including said first RF pulse and said first imaging sequence part in said first period of time.

6. The magnetic resonance imaging apparatus as recited in claim 3, wherein said scanning unit performs a second RF pulse for lessening signals from second background tissue in said region to be imaged and a second imaging sequence part for acquiring said second data disposed in said second region in said second period of time.

7. The magnetic resonance imaging apparatus as recited in claim 6, wherein said pulse sequence is a pulse sequence for rendering arterial blood, and said second background tissue is venous blood.

8. The magnetic resonance imaging apparatus as recited in claim 6, wherein said scanning unit repetitively performs a set including said second RF pulse and said second imaging sequence part in said second period of time.

9. The magnetic resonance imaging apparatus as recited in claim 3, wherein said scanning unit performs said first RF pulse and a third imaging sequence part for acquiring said third data disposed in said third region in said third period of time.

10. The magnetic resonance imaging apparatus as recited in claim 9, wherein said scanning unit repetitively performs a set including said first RF pulse and said third imaging sequence part in said third period of time.

11. The magnetic resonance imaging apparatus as recited in claim 3, wherein said scanning unit applies to said first RF pulse in said second period of time.

12. The magnetic resonance imaging apparatus as recited in claim 1, wherein said pulse sequence is a pulse sequence for rendering blood, and said first background tissue is cerebral white matter and gray matter.

13. The magnetic resonance imaging apparatus as recited in claim 1, wherein each of said plurality of sequence parts has a fat suppression pulse for suppressing fat before said first period of time.

14. The magnetic resonance imaging apparatus as recited in claim 13, wherein said second region lies nearer to said first region than said third region does.

15. The magnetic resonance imaging apparatus as recited in claim 1, wherein said third time interval is equal to said first time interval.

* * * * *